(12) United States Patent
Jiang et al.

(10) Patent No.: US 7,947,977 B2
(45) Date of Patent: May 24, 2011

(54) THIN FILM TRANSISTOR

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/384,309

(22) Filed: Apr. 2, 2009

(65) Prior Publication Data
US 2009/0283744 A1 Nov. 19, 2009

(30) Foreign Application Priority Data

May 14, 2008 (CN) .............................. 2008 1 0067171

(51) Int. Cl.
H01L 35/24 (2006.01)

(52) U.S. Cl. ....... 257/40; 257/27; 257/38; 257/E51.005; 977/742; 977/762; 977/936

(58) Field of Classification Search .................... 257/27, 257/38.59, E51.05, 29.151, 27.1, 38, 40; 977/742, 936, 952, 762
See application file for complete search history.

(56) References Cited

U.S. PATENT DOCUMENTS

| 6,423,583 | B1 | 7/2002 | Avouris et al. |
| 6,814,832 | B2 | 11/2004 | Utsunomiya |
| 6,921,575 | B2 | 7/2005 | Horiuchi et al. |
| 7,285,501 | B2 | 10/2007 | Mardilovich et al. |
| 7,399,400 | B2 | 7/2008 | Soundarrajan et al. |
| 7,537,975 | B2 | 5/2009 | Moon et al. |
| 2002/0163079 | A1 | 11/2002 | Awano |
| 2004/0251504 | A1* | 12/2004 | Noda .............................. 257/369 |
| 2005/0061496 | A1 | 3/2005 | Matabayas, Jr. |
| 2005/0079659 | A1 | 4/2005 | Duan et al. |
| 2005/0106846 | A1 | 5/2005 | Dubin et al. |
| 2005/0189535 | A1 | 9/2005 | Hsueh et al. |
| 2006/0249817 | A1* | 11/2006 | Kawase et al. ................. 257/622 |
| 2007/0004191 | A1 | 1/2007 | Gu et al. |
| 2007/0012922 | A1 | 1/2007 | Harada et al. |
| 2007/0029612 | A1 | 2/2007 | Sandhu |
| 2007/0069212 | A1 | 3/2007 | Saitoh et al. |

(Continued)

FOREIGN PATENT DOCUMENTS

CN 1484865 3/2004

(Continued)

OTHER PUBLICATIONS

R. E. I. Schropp, B. Stannowski, J. K. Rath, New challenges in thin film transistor research, Journal of Non-Crystalline Solids, 299-302, 2002, 1304-1310, 2002.

(Continued)

*Primary Examiner* — Wai-Sing Louie
(74) *Attorney, Agent, or Firm* — D. Austin Bonderer

(57) ABSTRACT

A thin film transistor includes a source electrode, a drain electrode, a semiconducting layer, and a gate electrode. The drain electrode is spaced from the source electrode. The semiconducting layer is electrically connected to the source electrode and the drain electrode. The gate electrode is insulated from the source electrode, the drain electrode, and the semiconducting layer by an insulating layer. The at least one of the source electrode, drain electrode, and the gate electrode includes a metallic carbon nanotube layer. The metallic carbon nanotube layer includes a plurality of metallic carbon nanotubes.

17 Claims, 4 Drawing Sheets

U.S. PATENT DOCUMENTS

| | | | |
|---|---|---|---|
| 2007/0085460 A1 | 4/2007 | Harutyunyan et al. | |
| 2007/0108480 A1 | 5/2007 | Nanai et al. | |
| 2007/0132953 A1 | 6/2007 | Silverstein | |
| 2007/0138010 A1 | 6/2007 | Ajayan | |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2008/0042287 A1 | 2/2008 | Furukawa et al. | |
| 2008/0134961 A1 | 6/2008 | Bao et al. | |
| 2008/0173864 A1 | 7/2008 | Fujita et al. | |
| 2008/0252202 A1 | 10/2008 | Li et al. | |
| 2008/0265293 A1 | 10/2008 | Lee et al. | |
| 2008/0277718 A1 | 11/2008 | Ionescu et al. | |
| 2009/0098453 A1 | 4/2009 | Liu et al. | |
| 2009/0159891 A1 | 6/2009 | Daniel et al. | |
| 2009/0224292 A1 | 9/2009 | Asano et al. | |
| 2009/0256594 A1* | 10/2009 | Zhu | 326/104 |
| 2009/0272967 A1 | 11/2009 | Afzali-Ardakani et al. | |
| 2009/0282802 A1 | 11/2009 | Cooper et al. | |
| 2010/0028613 A1 | 2/2010 | Schmidt et al. | |
| 2010/0252802 A1* | 10/2010 | Numata et al. | 257/9 |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | WO2006093601 A2 | 9/2006 |
| WO | WO2007/089322 | 8/2007 |
| WO | WO2007126412 | 11/2007 |
| WO | WO2008075642 | 6/2008 |

OTHER PUBLICATIONS

IBM research article on IBM research site (enclosed herein, 2004).

Jiang et al. ("Spinning and processing continuous yarns from 4-inch wafer scale super-aligned carbon nanotube arrays", Advanced Materials, 18, pp. 1505-1510, 2006).

Hines "Nanotransfer printing of organic and carbon nanotube thin-film transistors on plastic substrates", Applied Physics Letters, 86,163101 (2005).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Li "Removal of shells of multi-wall carbon nanotubes by repeatedly scanning bias voltage" Science in China Ser. E, Technological Sciences, vol. 47 No. 1 pp. 1-5 (2004).

Minko et al. "Two-level structured self-adaptive surfaces with reversibly tunable properties", Journal of American Chemical Society, 125, pp. 3896-3900, 2003.

Meitl et al., Solution Casting and Transfer Printing Single-Walled Carbon Nanotube Films, Nano Letters, 2004, vol. 4, No. 9.

* cited by examiner

US 7,947,977 B2

THIN FILM TRANSISTOR

RELATED APPLICATIONS

This application is related to applications entitled, "METHOD FOR MAKING THIN FILM TRANSISTOR", Ser. No. 12/384,245, filed on Apr. 2, 2009; "METHOD FOR MAKING THIN FILM TRANSISTOR", Ser. No. 12/384,331, filed on Apr. 2, 2009; "THIN FILM TRANSISTOR", Ser. No. 12/384,329, filed on Apr. 2, 2009; "THIN FILM TRANSISTOR", Ser. No. 12/384,310, filed on Apr. 2, 2009; "THIN FILM TRANSISTOR PANEL", Ser. No. 12/384,244, filed on Apr. 2, 2009; "THIN FILM TRANSISTOR", Ser. No. 12/384,281, filed on Apr. 2, 2009; "THIN FILM TRANSISTOR", Ser. No. 12/384,299, filed on Apr. 2, 2009; "THIN FILM TRANSISTOR", Ser. No. 12/384,292, filed on Apr. 2, 2009; "THIN FILM TRANSISTOR", Ser. No. 12/384,293, filed on Apr. 2, 2009; "THIN FILM TRANSISTOR", Ser. No. 12/384,330, filed on Apr. 2, 2009; "METHOD FOR MAKING THIN FILM TRANSISTOR", Ser. No. 12/384,241, filed on Apr. 2, 2009; "THIN FILM TRANSISTOR", Ser. No. 12/384,238, filed on Apr. 2, 2009. The disclosures of the above-identified applications are incorporated herein by reference.

BACKGROUND

1. Field of the Invention

The present invention relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconducting layer from an accumulation state to a depletion state, with applied voltage to the gate electrode, to change an amount of the current passing between the drain electrode and the source electrode.

Usually, the material of the semiconducting layer is amorphous silicone (a-Si), poly-silicone (p-Si), or organic semiconducting material. The material of the insulating layer is silicon nitride ($Si_3N4$) or silicon dioxide ($SiO_2$). The material of the gate electrode, source electrode, and drain electrode is metals or alloys. However, the conventional thin film transistor is inflexible, and not suitable for use in a flexible electronic device (e.g., a flexible display). Further, the gate, source, and drain electrodes made of metals or alloys will melt at high temperature. Thus, thin films transistors cannot be used in extreme conditions or environments.

What is needed, therefore, is a TFT in which can handle extreme conditions.

BRIEF DESCRIPTION OF THE DRAWINGS

Many aspects of the present thin film transistor can be better understood with references to the following drawings. The components in the drawings are not necessarily drawn to scale, the emphasis instead being placed upon clearly illustrating the principles of the present thin film transistor.

Figure 1:
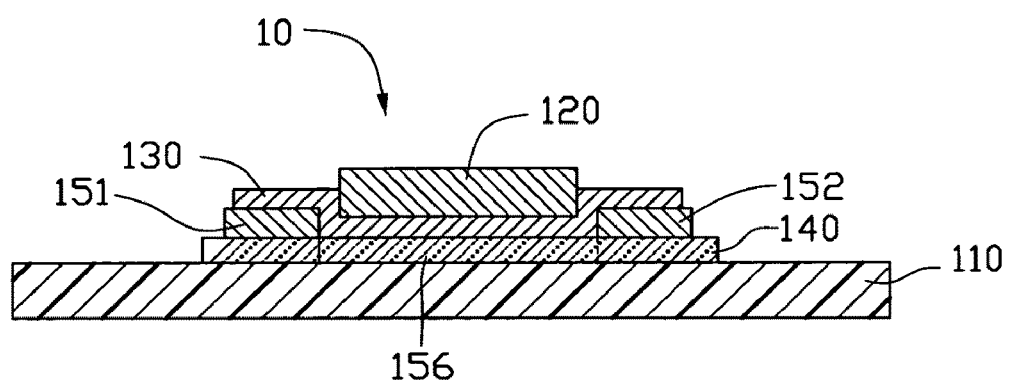
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconducting layer 140, a source electrode 151, a drain electrode 152, an insulating layer 130, and a gate electrode 120. The thin film transistor 10 is disposed on an insulating substrate 110.

The semiconducting layer 140 is disposed on the insulating substrate 110. The source electrode 151 and the drain electrode 152 are spaced therebetween and electrically connected to the semiconducting layer 140. The insulating layer 130 is disposed between the semiconducting layer 140 and the gate electrode 120. The insulating layer 130 is disposed at least on the semiconducting layer 140, or covers the semiconducting layer 140, the source electrode 151, and the drain electrode 152. The gate electrode 120 is disposed on the insulating layer 130. The gate electrode 120 is disposed above the semiconducting layer 140 and insulating from the semiconducting layer 140, the source electrode 151, and the drain electrode 152 by the insulating layer 130. A channel 156 is formed in the semiconducting layer 140 at a region between the source electrode 151 and the drain electrode 152.

The source electrode 151 and the drain electrode 152 can be disposed on the semiconducting layer 140 or on the insulating substrate 110. More specifically, the source electrode 151 and the drain electrode 152 can be disposed on a top surface of the semiconducting layer 140, and at the same side of the semiconducting layer 140 as the gate electrode 120. In other embodiments, the source electrode 151 and the drain electrode 152 can be disposed on the insulating substrate 110 and covered by the semiconducting layer 140. The source electrode 151 and the drain electrode 152 are at a different side of the semiconducting layer 140 from the gate electrode 120. In other embodiments, the source electrode 151 and the drain electrode 152 can be formed on the insulating substrate 110, and coplanar with the semiconducting layer 140.

The insulating substrate 110 is provided for supporting the thin film transistor 10. The material of the insulating substrate 110 can be the same as a substrate of a printed circuit board (PCB), and can be selected from rigid materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 is arbitrary. A plurality of thin film transistors 10 can be disposed on the insulating substrate 110 to form a thin film transistor panel.

The material of the semiconducting layer 140 can be selected from a group consisting of amorphous silicone (a-Si), poly-silicone (p-Si), organic semiconducting material, or semiconducting carbon nanotubes. In the present embodiment, the semiconducting layer 140 is a semiconducting carbon nanotube layer. The semiconducting carbon nanotube layer includes a plurality of single-walled carbon nanotubes, double-walled carbon nanotubes, or combination thereof. A diameter of the single-walled carbon nanotubes is in the approximate range from 0.5 nanometers to 50 nanometers. A diameter of the double-walled carbon nanotubes is in the approximate range from 1.0 nanometer to 50 nanometers. In the present embodiment, the diameter of the semiconducting carbon nanotubes is less than 10 nanometers.

Specifically, the semiconducting carbon nanotube layer can be a carbon nanotube film or can include a plurality of stacked carbon nanotube films. The carbon nanotube film is formed by a plurality of carbon nanotubes, ordered or otherwise, and has a uniform thickness. The carbon nanotube film can be an ordered film or a disordered film. In the disordered film, the carbon nanotubes are disordered or isotropic. The disordered carbon nanotubes entangle with each other. The isotropic carbon nanotubes are substantially parallel to a surface of the carbon nanotube film. In the ordered film, the carbon nanotubes are primarily oriented along a same direction in each film and parallel to a surface of the carbon nanotube film. Different stratums/layers of films can have the nanotubes offset from the nanotubes in other films. In one embodiment, the ordered carbon nanotube film includes a plurality of successive and oriented carbon nanotubes joined end to end by van der Waals attractive force.

When the carbon nanotube layer includes a plurality of ordered carbon nanotube films, the carbon nanotubes in different carbon nanotube films can be aligned along a same direction, or aligned along a different direction. An angle α between the alignment directions of the carbon nanotubes in each two adjacent carbon nanotube films is in the range $0 \leq \alpha \leq 90°$.

It is to be understood that, the semiconducting carbon nanotube layer can include at least one carbon nanotube yarn structure. A carbon nanotube yarn has the shape of a very narrow film. The microscopic structures of the oriented carbon nanotube film and the carbon nanotube yarn structure are similar. The carbon nanotube yarn structure includes a plurality of successive and oriented carbon nanotubes joined end to end by van der Waals attractive force. The carbon nanotubes in the carbon nanotube yarn structure are substantially aligned along a length direction of the carbon nanotube yarn structure. Further, the carbon nanotube yarn structure can be twisted or untwisted. The twisted carbon nanotube yarn structure has a round-shaped cross section.

A length of the semiconducting layer 140 can be in an approximate range from 1 micron to 100 microns. A width of the semiconducting layer 140 can be in an approximate range from 1 micron to 1 millimeter. A thickness of the semiconducting layer 140 can be in an approximate range from 0.5 nanometers to 100 microns. A length of the channel 156 can be in an approximate range from 1 micron to 100 microns. A width of the channel 156 can be in an approximate range from 1 micron to 1 millimeter. In the present embodiment, the length of the semiconducting layer 140 is about 50 microns, the width of the semiconducting layer is about 300 microns, the thickness of the semiconducting layer 140 is about 1 microns, the length of the channel 156 is about 40 microns, and the width of the channel 156 is about 300 microns.

The material of the insulating layer 130 can be a rigid material such as silicon nitride ($Si_3N_4$) or silicon dioxide ($SiO_2$), or a flexible material such as polyethylene terephthalate (PET), benzocyclobutenes (BCB), or acrylic resins. A thickness of the insulating layer 130 can be in an approximate range from 5 nanometers to 100 microns. In the present embodiment, the insulating layer 130 is $Si_3N_4$.

The source electrode 151, the drain electrode 152, and/or the gate electrode 120 comprise a metallic carbon nanotube layer. The metallic carbon nanotube layer includes plurality of metallic carbon nanotubes.

Figure 2:
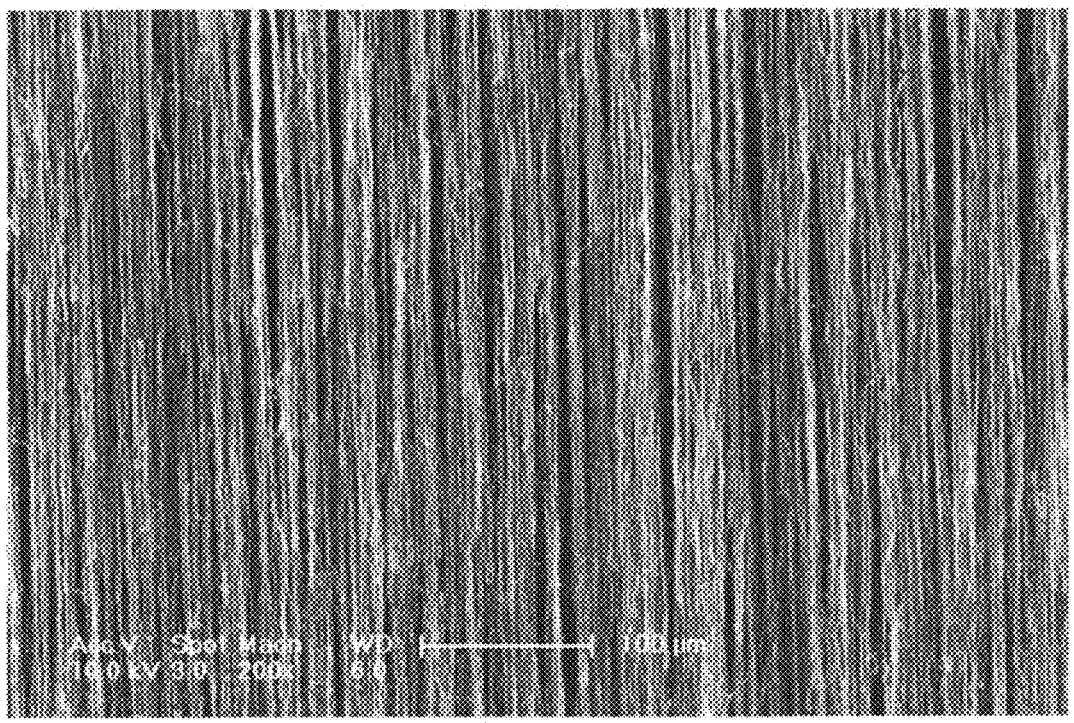
FIG. 2 shows a Scanning Electron Microscope (SEM) image of a carbon nanotube film containing metallic carbon nanotubes used in the thin film transistor of FIG. 1.

Specifically, the metallic carbon nanotube layer can be a carbon nanotube film or can include a plurality of stacked carbon nanotube films. The carbon nanotube film is formed by a plurality of carbon nanotubes, ordered or otherwise, and has a uniform thickness. The carbon nanotube film can be an ordered film or a disordered film. In the disordered film, the carbon nanotubes are disordered or isotropic. The disordered carbon nanotubes entangle with each other. The isotropic carbon nanotubes are substantially parallel to a surface of the carbon nanotube film. In the ordered film, the carbon nanotubes are primarily oriented along a same direction in each film and parallel to a surface of the carbon nanotube film. Different stratums/layers of films can have the nanotubes offset from the nanotubes in other films. Referring to FIG. 2, in one embodiment, the ordered carbon nanotube film includes a plurality of successive and oriented carbon nanotubes joined end to end by van der Waals attractive force.

When the carbon nanotube layer includes a plurality of ordered carbon nanotube film, the carbon nanotubes in different carbon nanotube film can be aligned along a same direction, or aligned along a different direction. An angle α between the alignment directions of the carbon nanotubes in each two adjacent carbon nanotube films is in the range $0 < \alpha \leq 90°$.

It is to be understood that, the metallic carbon nanotube layer can include at least one carbon nanotube yarn structure. The carbon nanotube yarn structure includes a plurality of successive and oriented carbon nanotubes joined end to end by van der Waals attractive force. The carbon nanotubes in the carbon nanotube yarn structure are substantially aligned along a length direction of the carbon nanotube yarn structure. The carbon nanotube yarn structure can be twisted or untwisted.

The metallic carbon nanotube layer can include single-walled carbon nanotubes, double-walled carbon nanotubes, multi-walled carbon nanotubes, or combinations thereof. A diameter of the single-walled carbon nanotubes can be in an approximate range from 0.5 nanometers to 50 nanometers. A diameter of the double-walled carbon nanotubes can be in an approximate range from 1 nanometer to 50 nanometers. A diameter of the multi-walled carbon nanotubes can be in an approximate range from 1.5 nanometers to 50 nanometers.

The ordered carbon nanotube film with carbon nanotubes joined end to end is directly drawn from a carbon nanotube array.

Figure 3:
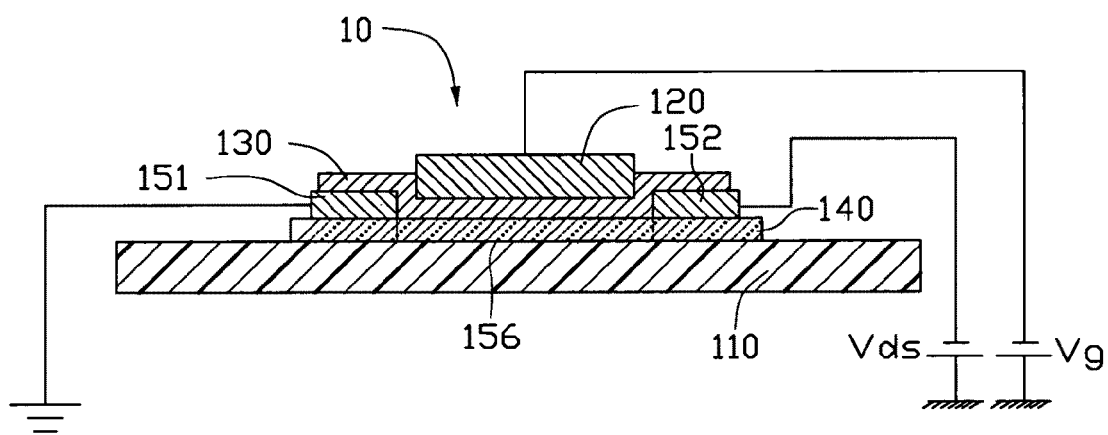
FIG. 3 is a schematic view of the thin film transistor of FIG. 1 connected to a circuit.

Referring to FIG. 3, in use, the source electrode 151 is grounded. A voltage Vds is applied on the drain electrode 152. Another voltage Vg is applied on the gate electrode 120. The voltage Vg forming an electric field in the channel 156 of the semiconducting layer 140. Accordingly, carriers exist in the channel nearing the gate electrode 120. As the Vg increasing, a current can flow through the channel 156. Thus, the source electrode 151 and the drain electrode 152 are electrically connected. When the source electrode 151, the drain electrode 152, and the gate electrode 120 comprise metallic carbon nanotube layer, and the semiconducting layer 140 is semiconducting carbon nanotube layer, the carrier mobility of the thin film transistor in the present embodiment is higher than 10 $cm^2/V^{-1}s^{-1}$ (e.g., 10 to 1500 $cm^2/V^{-1}s^{-1}$), and the on/off current ratio is in an approximate range from $1.0\times 10^2 \sim 1.0\times 10^6$.

Figure 4:
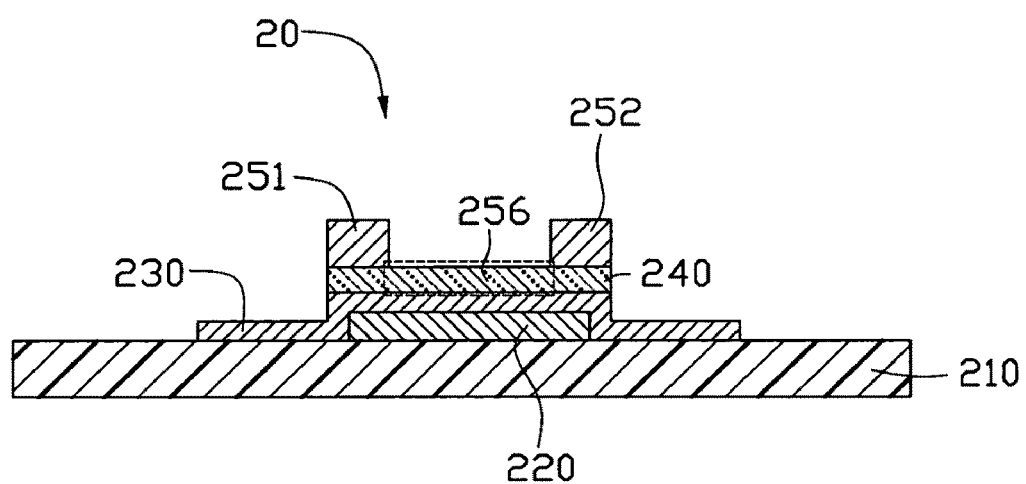
FIG. 4 is a cross sectional view of a thin film transistor in accordance with a second embodiment.

Referring to FIG. 4, a thin film transistor 20 is provided in a second embodiment and has a bottom gate structure. The thin film transistor 20 includes a gate electrode 220, an insulating layer 230, a semiconducting layer 240, a source electrode 251, and a drain electrode 252. The thin film transistor 20 is disposed on an insulating substrate 210.

The structure of the thin film transistor 20 in the second embodiment is similar to the thin film transistor 10 in the first embodiment. The difference is that, in the second embodiment, the gate electrode 220 is disposed on the insulating substrate 210. The insulating layer 230 covers the gate electrode 220. The semiconducting layer 240 is disposed on the insulating layer 230, and insulated from the gate electrode 220 by the insulating layer 230. The source electrode 251 and the drain electrode 252 are spaced apart from each other and electrically connected to the semiconducting layer 240. The source electrode 251, and the drain electrode 252 are insulated from the gate electrode 220 by the insulating layer 230. A channel 256 is formed in the semiconducting layer 240 at a region between the source electrode 251 and the drain electrode 252.

The source electrode 251 and the drain electrode 252 can be disposed on the semiconducting layer 240 or on the insulating layer 230. More specifically, the source electrode 251 and the drain electrode 252 can be disposed on a top surface of the semiconducting layer 240, and at the same side of the semiconducting layer 240 with the gate electrode 220. In other embodiments, the source electrode 251 and the drain electrode 252 can be disposed on the insulating layer 230 and covered by the semiconducting layer 240. The source electrode 251 and the drain electrode 252 are at a different side of the semiconducting layer 240 from the gate electrode 220. In other embodiments, the source electrode 251 and the drain electrode 252 can be formed on the insulating layer 230, and coplanar with the semiconducting layer 240.

The thin film transistors provided in the present embodiments have the following superior properties: Firstly, the metallic carbon nanotube layer is tough and flexible. Thus, thin film transistors using metallic carbon nanotube layers as electrodes are durably flexible. Secondly, the metallic carbon nanotube layer is durable at high temperatures. Thirdly, the thermal conductivity of the metallic carbon nanotube layer is relatively high. Thus, in use, heat produced by the thin film transistor can be rapidly spread out and easily dissipated. Fourthly, flexibility of the thin film transistors using the carbon nanotube based semiconducting layer can be improved.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

The invention claimed is:

1. A thin film transistor comprising:
a source electrode;
a drain electrode spaced from the source electrode;
a semiconducting layer electrically connected to the source electrode and the drain electrode; and
a gate electrode insulated from the source electrode, the drain electrode, and the semiconducting layer by an insulating layer;
wherein at least one of the source electrode, drain electrode, and the gate electrode comprises a metallic carbon nanotube layer, the metallic carbon nanotube layer comprises at least one carbon nanotube yarn structure, the at least one carbon nanotube yarn structure comprises a plurality of successive and oriented carbon nanotubes joined end to end by van der Waals attractive force.

2. The thin film transistor of claim 1, wherein the metallic carbon nanotube layer comprises a plurality of stacked metallic carbon nanotube films.

3. The thin film transistor of claim 1, wherein the carbon nanotubes are substantially parallel to a surface of the metallic carbon nanotube layer.

4. The thin film transistor of claim 1, wherein the metallic carbon nanotube layer comprises a metallic carbon nanotube film, the metallic carbon nanotube film comprises a plurality of metallic carbon nanotubes primarily oriented along a same direction and parallel to a surface of the metallic carbon nanotube film.

5. The thin film transistor of claim 4, wherein the plurality of metallic carbon nanotubes are successive and joined end to end by van der Waals attractive force.

6. The thin film transistor of claim 5, wherein the metallic carbon nanotube layer further comprises stacked metallic carbon nanotube films, an angle α between alignment directions of the metallic carbon nanotubes in each two adjacent metallic carbon nanotube films is in the range $0<\alpha\leq 90°$.

7. The thin film transistor of claim 1, wherein the at least one carbon nanotube yarn structure is twisted and has a round-shaped cross section.

8. The thin film transistor of claim 1, wherein the insulating layer is disposed between the semiconducting layer and the gate electrode.

9. The thin film transistor of claim 1, wherein the semiconducting layer is disposed on an insulating substrate, the source electrode and the drain electrode are disposed on an surface of the semiconducting layer, the insulating layer is disposed on the semiconducting layer, and the gate electrode is disposed on the insulating layer.

10. The thin film transistor of claim 1, wherein the gate electrode is disposed on an insulating substrate, the insulating layer is disposed on the gate electrode, the semiconducting layer is disposed on the insulating layer, the source electrode and the drain electrode are disposed on an surface of the semiconducting layer.

11. The thin film transistor of claim 1, wherein a material of the semiconducting layer is selected from the group consisting amorphous silicone, poly-silicone, organic semiconducting material, and semiconducting carbon nanotube layer, and the semiconducting carbon nanotube layer comprises a plurality of semiconducting carbon nanotubes.

12. The thin film transistor of claim 11, wherein the semiconducting carbon nanotube layer comprises a single layer of semiconducting carbon nanotube film or stacked semiconducting carbon nanotube films, the semiconducting carbon nanotube film comprises a plurality of semiconducting carbon nanotubes.

13. The thin film transistor of claim 12, wherein in the semiconducting carbon nanotube film, the semiconducting carbon nanotubes are parallel to a surface of the carbon nanotube film and are either disordered, isotropic, or primarily oriented along a same direction.

14. The thin film transistor of claim 11, wherein the semiconducting carbon nanotubes are successive and joined end to end by van der Waals attractive force.

15. The thin film transistor of claim 12, wherein a diameter of the semiconducting carbon nanotubes is less than 10 nanometers.

16. A thin film transistor comprising:
a source electrode;
a drain electrode spaced from the source electrode;
a semiconducting layer electrically connected to the source electrode and the drain electrode; and a gate electrode insulated from the source electrode, the drain electrode, and the semiconducting layer by an insulating layer;

wherein at least one of the source electrode, drain electrode, and the gate electrode comprises a metallic carbon nanotube layer, the metallic carbon nanotube layer comprises at least one metallic carbon nanotube yarn structure, the at least one metallic carbon nanotube yarn structure comprises a plurality of successive metallic carbon nanotubes oriented along a same direction and parallel to a surface of the at least one metallic carbon nanotube yarn structure.

17. A thin film transistor comprising:

a source electrode;

a drain electrode spaced from the source electrode;

a semiconducting layer electrically connected to the source electrode and the drain electrode; and a gate electrode insulated from the source electrode, the drain electrode, and the semiconducting layer by an insulating layer;

wherein at least one of the source electrode, drain electrode, and the gate electrode comprises a metallic carbon nanotube layer, and the metallic carbon nanotube layer comprises at least one carbon nanotube yarn structure, the at least one carbon nanotube yarn structure comprises a plurality of successive and oriented carbon nanotubes.

* * * * *